(12) United States Patent
Feng et al.

(10) Patent No.: US 11,073,483 B2
(45) Date of Patent: Jul. 27, 2021

(54) DISPLAY DEVICE AND BONDING ACCURACY DETECTION METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Binfeng Feng, Beijing (CN); Xiaoxia Liu, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

(*) Notice: Subject to any disclaimer, the term of this patent is extended or adjusted under 35 U.S.C. 154(b) by 166 days.

(21) Appl. No.: 16/419,347

(22) Filed: May 22, 2019

(65) Prior Publication Data
US 2020/0116646 A1    Apr. 16, 2020

(30) Foreign Application Priority Data
Oct. 10, 2018  (CN) .......................... 201811176366.9

(51) Int. Cl.
*G01N 21/88*    (2006.01)
*G01N 21/64*    (2006.01)
*G02F 1/1333*   (2006.01)
*H01L 51/00*    (2006.01)
*H01L 51/50*    (2006.01)
(Continued)

(52) U.S. Cl.
CPC ............. *G01N 21/88* (2013.01); *G01N 21/64* (2013.01); *G02F 1/133308* (2013.01);
(Continued)

(58) Field of Classification Search
CPC .... G01N 21/88; G01N 21/64; G01N 21/8803; G02F 1/133308; G02F 2001/133331;
(Continued)

(56) References Cited

U.S. PATENT DOCUMENTS

| 5,635,722 A * | 6/1997 | Wakamoto ............ G03F 9/7015 250/548 |
| 2011/0051056 A1* | 3/2011 | Li ........................ G02F 1/1333 349/106 |

FOREIGN PATENT DOCUMENTS

| CN | 102004347 A | 4/2011 |
| CN | 102608797 A | 7/2012 |

(Continued)

OTHER PUBLICATIONS

The First Chinese Office Action dated Apr. 23, 2020; Appln. No. 201811176366.9.

*Primary Examiner* — David P Porta
*Assistant Examiner* — Meenakshi S Sahu

(57) ABSTRACT

A display device and a detection method are provided. The display device includes a display panel including an effective area and a peripheral area located around the effective area; and a cover plate attached to the display panel, the cover plate including a visible region, and the boundary of the visible region of the cover plate is located outside the boundary of the effective region of the display panel in a direction parallel to the display panel; at least one pair of light sensitive luminescent marks disposed on the display panel and located near mutually opposite edges of the display panel. Each of the at least one pair of light sensitive luminescent marks is disposed inside or outside an effective area of the display panel in a direction parallel to the display panel.

19 Claims, 4 Drawing Sheets

(51) Int. Cl.
  *H01L 51/52*  (2006.01)
  *G06F 3/041*  (2006.01)
(52) U.S. Cl.
  CPC ...... *H01L 51/0031* (2013.01); *H01L 51/5012* (2013.01); *H01L 51/5237* (2013.01); *G02F 1/133331* (2021.01); *G06F 3/041* (2013.01)
(58) Field of Classification Search
  CPC ..... G02F 2001/133354; H01L 51/0031; H01L 51/5012; H01L 51/5237; H01L 2223/54473; H01L 2223/54426; H01L 2223/54486; H01L 23/544; G06F 3/041; G06F 2203/04103; G06F 3/0421; G09F 9/33; G09F 9/35; G01M 11/00
  See application file for complete search history.

(56) References Cited

FOREIGN PATENT DOCUMENTS

| | | | |
|---|---|---|---|
| CN | 103075970 A | 5/2013 | |
| CN | 104020882 A | 9/2014 | |
| CN | 104020883 A | 9/2014 | |
| CN | 203941362 U | 11/2014 | |
| CN | 104698591 A | 6/2015 | |
| CN | 105652492 A | 6/2016 | |
| CN | 105807964 A | 7/2016 | |
| CN | 106773264 A | 5/2017 | |
| CN | 207381435 U | 5/2018 | |
| KR | 20180084683 A | 7/2018 | |
| WO | WO20180722207 | * 4/2018 | ......... H01L 27/3244 |

* cited by examiner

```
Illuminating the display module from the side of the cover
  plate to illuminate the light-sensitive luminescent mark
                         │
                         ▼
Detecting whether the light is emitted from the visible area,
 and judging whether the matching precision of the display
 module is up to standard according to the detection result
```

DISPLAY DEVICE AND BONDING ACCURACY DETECTION METHOD

This application claims priority to the Chinese patent application No. 201811176366.9, filed on Oct. 10, 2018, the entire disclosure of which is incorporated herein by reference as part of the present application.

TECHNICAL FIELD

The disclosure relates to a display device and a bonding accuracy detection method.

BACKGROUND

With the development of flexible display device technology, the module frame of the display device is getting narrower and narrower, and the requirements for the bonding accuracy of the display device are getting higher and higher. At present, after the module bonding process (bonding of the display panel and the cover plate), it is usually necessary to detect the bonding accuracy of the display device to judge whether the deviation distance between the display panel and the cover plate is within the bonding accuracy distance. In order to detect the bonding accuracy, it is necessary to carry out random inspection or full inspection on the display device, and the detection method is often manual microscope examination.

SUMMARY

At least one embodiment of the disclosure provides a display device comprising: a display panel comprising an effective area and a peripheral area located around the effective area; and a cover plate attached to the display panel, the cover plate comprising a visible region, and a boundary of the visible region of the cover plate is located outside a boundary of the effective region of the display panel in a direction parallel to the display panel; at least one pair of light sensitive luminescent marks are arranged on the display panel and located near opposite sides of the display panel, wherein in the direction parallel to the display panel, each of the at least one pair of light sensitive luminescent marks is disposed inside the effective area of the display panel and a distance between an inner edge of each light sensitive luminescent mark and the boundary of the effective area of the display panel is an offset limit value of the display panel and the cover plate; or, each of the at least one pair of light sensitive luminescent marks is disposed outside the visible region of the cover plate and the distance between the inner edge of each of the light sensitive luminescent marks and a boundary of the visible region is the offset limit value.

In some examples, the light sensitive luminescent markers comprise at least a first pair of oppositely disposed light sensitive luminescent markers and a second pair of oppositely disposed light sensitive luminescent markers, and wherein the first pair of oppositely disposed light sensitive luminescent markers are located near first opposite sides of the display panel, and the second pair of oppositely disposed light sensitive luminescent markers are located near second opposite sides of the display panel, wherein the first opposite sides are perpendicular to the second opposite sides.

In some examples, the display panel is an organic light emitting diode (OLED) display panel, comprising a first substrate; an anode formed on the first substrate; a light emitting layer formed on the anode; a cathode formed on the light emitting layer; and a package protection layer formed on the cathode, wherein the light sensitive luminescent marks are arranged on a surface of the light emitting layer close to the cathode or on a surface of the package protection layer away from the cathode.

In some examples, the display panel is a liquid crystal display panel, comprising an array substrate and a color film substrate which are arranged opposite to each other; and a liquid crystal layer arranged between the array substrate and the color film substrate, wherein the light sensitive luminescent marks are arranged on a surface of the color film substrate away from the liquid crystal layer.

In some examples, the display panel is a touch display panel and comprises a display structure and a touch panel which are overlapped with each other, wherein the light sensitive luminescent marks are arranged in the display structure or in the touch panel.

In some examples, the effective area of the display panel is a display effective area of the display structure or a touch effective area of the touch panel.

In some examples, the display effective area of the display structure is located inside the touch effective area of the touch panel in the direction parallel to the display panel.

In some examples, the touch panel comprises a second substrate; a first transparent optical adhesive layer disposed on the second substrate; a first transparent electrode layer disposed on the first transparent optical adhesive layer; a second transparent optical adhesive layer disposed on the first transparent electrode layer; a second transparent electrode layer disposed on the second transparent optical adhesive layer; and a protection layer disposed on the second transparent electrode layer, wherein the light sensitive luminescent marks are arranged on at least one of the following positions: on a surface of the first transparent electrode layer close to the second transparent optical adhesive layer; on a surface of the second transparent electrode layer close to the protection layer; and on a surface of the protection layer away from the second transparent electrode layer.

In some examples, each light sensitive luminescent mark has a planar shape of strip shape, triangular, T-shape or cross-shape.

In some examples, each of the light sensitive luminescent marks has an overall elongated shape, and an extension direction of the elongated shape is parallel to an edge of the display panel adjacent to the light sensitive luminescent mark.

In some examples, each of the light sensitive luminescent marks comprises a plurality of sub-marks, and the plurality of sub-marks are arranged along the extension direction.

In some examples, a plurality of sub-marks in each of the light sensitive luminescent marks are arranged at equal intervals.

In some examples, at least one sub-mark in each of the light sensitive luminescent marks or each of the light sensitive luminescent marks comprises a plurality of stripes arranged in a direction perpendicular to the edge adjacent to the light sensitive luminescent mark.

In some examples, the plurality of stripes are parallel to the edge adjacent to the light sensitive luminescent mark and are arranged at equal intervals.

In some examples, each of the light sensitive luminescent markers has a material of fluorescent material or phosphorescent material.

In some examples, the cover plate comprises a non-visible region located at the periphery of the visible region.

In some examples, an orthographic projection of the effective area of the display panel on a plane parallel to the display panel completely falls into an orthographic projection of the visible area of the cover plate on the plane parallel to the display panel.

In some examples, an orthographic projection of the display effective area of the display structure of the display panel on a plane parallel to the display panel completely falls into an orthographic projection of the touch effective area of the touch panel on the plane parallel to the display panel.

At least one embodiment of the disclosure provides a method for detecting the bonding accuracy of the cover plate of the display device as mentioned above, comprising: irradiating the display device from the cover plate side with light capable of causing the light sensitive luminescent marks to emit light; detecting whether the light is emitted from the visible area, and judging whether the bonding accuracy of the display device meets a standard according to a detection result.

In some examples, judging whether the bonding accuracy of the display device meets the standard according to the detection result comprises in a case where each of the at least one pair of light sensitive luminescent marks is disposed inside the effective area of the display panel, judging that the bonding accuracy of the display device meets the standard when the light is detected to be emitted from the visible area; or in a case where each of the at least one pair of light sensitive luminescent marks is disposed outside the visible region of the cover plate, judging that the bonding accuracy of the display device meets the standard when it is not detected that the light is emitted from the visible area.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

With the development of flexible display device technology, the module frame of the display device is getting narrower and narrower, and the requirements for the bonding accuracy of the display device are getting higher and higher. At present, after the module bonding process (the bonding of the display panel and the cover plate), it is usually necessary to detect the bonding accuracy of the display device and judge whether the deviation distance between the display panel and the cover plate is within the bonding accuracy distance. In order to detect the bonding accuracy, it is necessary to carry out random inspection or full inspection of the display device, and the detection method is often manual microscopic examination. However, it requires a lot of energy and time for workers, is inefficient, and the detection method of manual microscopic examination is not convenient enough.

Therefore, it is necessary to provide a display device and a bonding accuracy detection method that can quickly detect the bonding accuracy of the display device.

Figure 1:
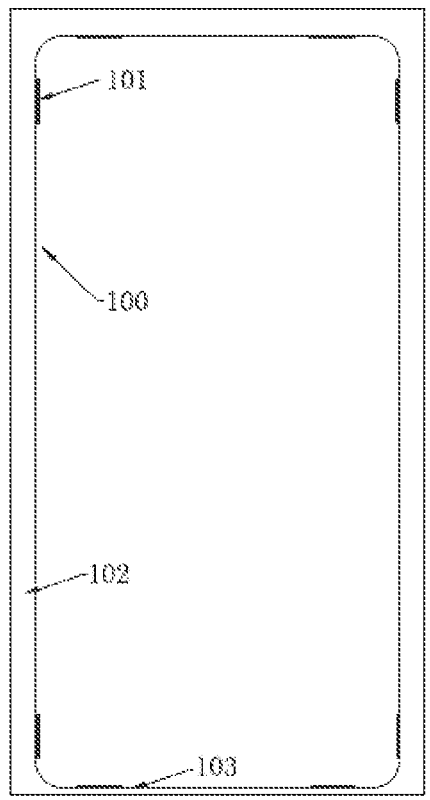
FIG. 1 illustrates a front view of a display panel in a display device according to an embodiment of the present disclosure.
Figure 2:
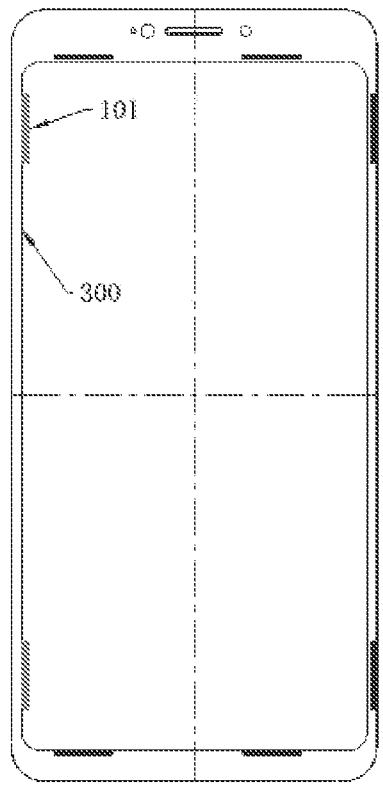
FIG. 2 illustrates a front view of a display device according to an embodiment of the present disclosure.

The embodiment of the present disclosure proposes a display device 200. For example, the display device may be a display module. As illustrated in FIG. 1 and FIG. 2, the display device 200 includes a cover plate 300 and a display panel 100 which are sequentially arranged from top to bottom. FIG. 1 illustrates a front view of a display panel 100, and FIG. 2 illustrates a front view of a display device 200 formed by attaching a cover plate 300 to the display panel 100. The display panel 100 is provided with at least one pair of oppositely arranged light sensitive luminescent marks 101, wherein each of the at least one pair of light sensitive luminescent marks 101 is a preset distance from the part of the boundary line between the effective area 104 and the routing area 105 adjacent thereto, and the preset distance is determined by a required bonding accuracy when the display panel 100 is bonded with the cover plate 300 and a projection distance between the effective area 104 and the visible area 301.

Figure 3:
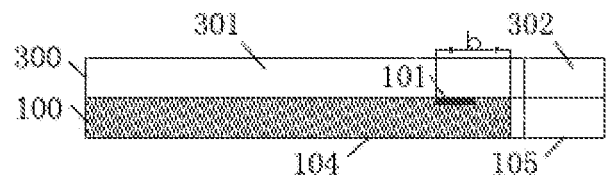
FIG. 3 illustrates a partial sectional view of a display device according to an embodiment of the present disclosure.
Figure 4:
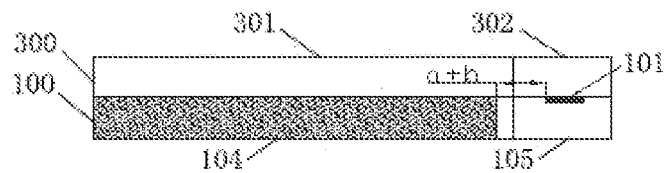
FIG. 4 illustrates a partial sectional view of a display device according to another embodiment of the present disclosure.

For example, as illustrated in FIG. 3 or FIG. 4, the cover plate 300 includes a visible region 301 and a border region 302 located at the periphery of the visible region 301. For example, the border region 302 is a non-visible region. For example, the border region 302 may block light.

For example, the light sensitive luminescent mark 101 may be formed on the display panel 100 by a patterning process. An exemplary patterning process may be vapor deposition, exposure development, or printing. After the light sensitive luminescent mark 101 is manufactured, the display device 200 is obtained by bonding the display panel 100 and the cover plate 300.

For example, the material of the light sensitive luminescent mark 101 may be a material that is transparent and sensitive to a special light source and emits light. Illustratively, it may be a fluorescent material or a phosphorescent material. The light sensitive luminescent marker 101 of the fluorescent material can emit light under the irradiation of ultraviolet rays, while the light sensitive luminescent marker 101 of the phosphorescent material can emit light under the irradiation of X-rays. In this embodiment, the preset distance is determined by the bonding accuracy required when the display panel 100 is bonded to the cover plate 300 and the projection distance between the effective area 104 and the visible area 301. The bonding accuracy should be understood as the allowable deviation distance between the cover plate 300 and the display panel 100 during bonding. When the deviation distance between the cover plate 300 and the display panel 100 is not greater than the bonding accuracy, the bonding accuracy of the display device 200 formed by the cover plate 300 and the display panel 100 is judged to be up to standard; however, when the deviation distance between the cover plate 300 and the display panel 100 is greater than the bonding accuracy, it is judged that the bonding accuracy of the display device 200 formed by the cover plate 300 and the display panel 100 is not up to standard. Since the light sensitive luminescent mark 101 is disposed on the display panel 100 based on a preset distance, the display device 200 can be irradiated with detection light, and whether the bonding accuracy of the display device 200 meets the standard can be judged according to whether the light sensitive luminescent mark 101 can be detected to emit light. Compared with the traditional microscopic examination, it improves the rapidity, saves more manpower and the working time of the staff, and improves the working efficiency. In this embodiment, the detection light can be selected according to the material of the photosensitive identification layer. It should be known that, in order to more accurately detect the bonding accuracy of the display panel 100, at least a pair of oppositely arranged light sensitive luminescent marks 101 are arranged on the display panel 100. In this way, whether the display device 200 meets the standard can be determined by detecting the oppositely arranged light sensitive luminescent marks 101, and the detection accuracy can be improved. Illustratively, the light sensitive luminescent marks 101 may be disposed in pairs near opposite sides of the display panel 100, for example, opposite long sides or short sides.

In one implementation of this embodiment, the light sensitive luminescent mark 101 includes at least a first pair of oppositely disposed light sensitive luminescent marks 101 and a second pair of oppositely disposed light sensitive luminescent marks 101. The first pair of oppositely disposed light sensitive luminescent marks 101 are disposed parallel to the first opposite sides 102 (e.g., the long sides of the display panel) of the display panel 100, and the second pair of oppositely disposed light sensitive luminescent marks 101 are disposed parallel to the second opposite sides 103 (e.g., the short sides of the display panel) of the display panel 100. For example, the first opposite sides 102 and the second opposite sides 103 may be perpendicular to each other.

For example, as illustrated in FIG. 1, the first opposite sides of the display panel 100 may be long sides or short sides of the display panel 100, while the second opposite sides of the display panel 100 and the first opposite sides are perpendicular to each other. When the display panel 100 is attached to the cover plate 300, it is possible to simultaneously consider the bonding accuracy between the lateral sides of the corresponding cover plate 300 and the first opposite sides and the second opposite sides of the display panel 100 which are perpendicular to each other. Therefore, the detection accuracy of the display device 200 can be improved by arranging the light sensitive luminescent marks 101 oppositely arranged on the first opposite sides and the second opposite sides, respectively.

In an embodiment of the present disclosure, the light sensitive luminescent mark 101 is disposed in the effective area 104 and the distance between the edge of the light sensitive luminescent mark 101 remote from the boundary and the boundary is the bonding accuracy.

For example, as illustrated in FIG. 3, the light sensitive luminescent mark 101 is disposed in the effective area 104 of the display panel 100, and the distance of the edge of the light sensitive luminescent mark 101 away from the boundary line between the effective area 104 and the routing area 105 has a distance of the bonding accuracy from the boundary line (the bonding accuracy is the distance of section b in FIG. 3). The bonding accuracy used when describing the distance between the light sensitive luminescent marks 101 and the boundary herein refers to the maximum allowable offset value between the display panel and the cover plate, that is, the offset limit value. It should be noted that when the deviation distance between the cover plate 300 and the display panel 100 is greater than the bonding accuracy, the light sensitive luminescent mark 101 provided on the display panel 100 is located outside the visual area 301 of the cover plate 300, while when the deviation distance between the cover plate 300 and the display panel 100 is not greater than the bonding accuracy, the light sensitive luminescent mark 101 provided on the display panel 100 is opposite to the cover plate 300 and is located inside the visual area 301 of the cover plate 300. For example, as illustrated in FIG. 3, each of the light sensitive luminescent marks 101 is disposed inside the effective area 104 of the display panel 100 and the distance between the inner edge of each of the light sensitive luminescent marks 101 (the left edge in FIG. 3) and the boundary of the effective area of the display panel 104 is the bonding accuracy of the display panel and the cover plate.

In operation, since the light sensitive luminescent mark 101 is arranged in the effective area 104 of the display panel 100, when the display device 200 is subjected to the bonding accuracy detection, if the bonding accuracy is up to the standard, that is, the deviation distance between the cover plate 300 and the display panel 100 is not greater than the bonding accuracy distance, the light sensitive luminescent mark 101 should be positioned below the visible area 301 of the cover plate 300. Therefore, under the irradiation of the detection light, the visible area 301 of the cover plate 300 should be able to detect the light emitted by the light sensitive luminescent mark 101; however, if the bonding accuracy is not up to standard, the deviation distance between the cover plate 300 and the display device 200 is greater than the bonding accuracy, and the light sensitive luminescent mark 101 is located outside the visible region 301 of the cover plate 300. Therefore, under the irradiation of the detection light, the visible region 301 of the cover plate 300 cannot detect the light emitted by the light sensitive luminescent mark 101. In this way, the bonding accuracy of the display device 200 can be detected, and the arrangement of the light sensitive luminescent mark 101 can be referred to as a "visual type".

In another embodiment of the present disclosure, the light sensitive luminescent mark 101 is disposed in the routing area 105 and the distance between the edge of the light sensitive luminescent mark 101 close to the boundary and the boundary is the sum of the bonding accuracy and the projection distance.

For example, in this embodiment, as illustrated in FIG. 4, the light sensitive luminescent mark 101 is disposed in the routing area 105 of the display panel 100, and the distance between the edge of the light sensitive luminescent mark 101 close to the boundary line and the boundary line is the sum of the bonding accuracy and the projection distance (the sum of the bonding accuracy and the projection distance is the distance of a+b segment in FIG. 4), it should be noted that, when the deviation distance between the cover plate 300 and the display panel 100 is greater than the bonding accuracy, the light sensitive luminescent mark 101 arranged on the display panel 100 is positioned below the visual area 301 of the cover plate 300, while when the deviation distance between the cover plate 300 and the display panel 100 is not greater than the bonding accuracy, the light sensitive luminescent mark 101 arranged on the display panel 100 is positioned outside the visual area 301 of the cover plate 300. For example, as illustrated in FIG. 4, each of the light sensitive luminescent markers 101 is disposed outside the visible region 301 of the cover plate 300, and the distance between the inner edge (the left edge in FIG. 4) of each light sensitive luminescent marker 101 and the boundary of the visible region 301 is the bonding accuracy between the display panel and the cover plate.

In operation, since the light sensitive luminescent mark 101 is arranged in the routing area 105 of the display panel 100, when the bonding accuracy of the display device 200 is detected, if the bonding accuracy reaches the standard, the deviation distance between the cover plate 300 and the display panel 100 is not greater than the bonding accuracy, the light sensitive luminescent mark 101 should be positioned outside the visible area 301 of the cover plate 300, therefore, under the irradiation of the detection light, the visible region 301 of the cover plate 300 should not be able to detect the light emitted by the light sensitive luminescent mark 101. If the bonding accuracy is not up to standard and the deviation distance between the cover plate 300 and the display panel 100 is greater than the bonding accuracy, the light sensitive luminescent mark 101 is located below the visible region 301 of the cover plate 300. Therefore, under the irradiation of the detection light, the visible region 301 of the cover plate 300 can detect the light emitted by the light sensitive luminescent mark 101. This arrangement of light sensitive luminescent marks 101 can be referred to as "hidden type".

Figure 5:
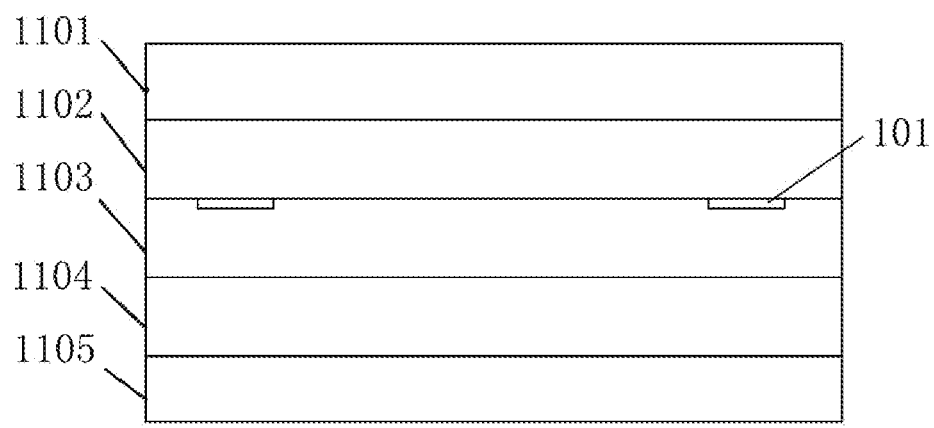
FIG. 5 illustrates a layer structure diagram of an OLED display panel in a display device according to an embodiment of the present disclosure.

In an embodiment of the present disclosure, as illustrated in FIG. 5, the display panel 100 is an OLED display panel 100 including a first substrate 1105; an anode 1104 formed on the first substrate 1105; a light emitting layer 1103 defined by a pixel defining layer formed on the anode 1104; a cathode 1102 formed on the light emitting layer 1103; and a package protection layer 1101. The light sensitive luminescent mark 101 is disposed on the surface of the luminescent layer 1103 close to the cathode 1102 or on the surface of the package protection layer 1101 away from the cathode 1102.

It should be noted that the region of the light emitting layer 1103 defined by the pixel defining layer is the active region 104, while the periphery is the routing region 105. The light sensitive luminescent mark 101 is disposed on the surface of the light emitting layer 1103 close to the cathode 1102 or on the surface of the package protection layer 1101 away from the cathode 1102. In one example of FIG. 5, the light sensitive luminescent mark 101 is located on the surface of the light emitting layer 1103 close to the cathode 1102.

Figure 6:
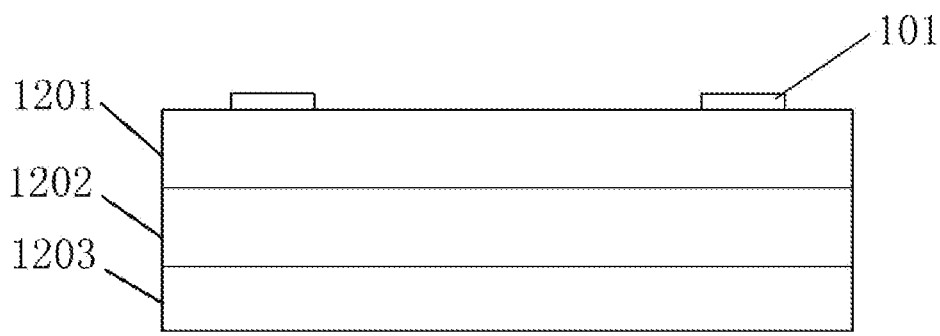
FIG. 6 illustrates a layer structure diagram of a liquid crystal display panel in a display device according to another embodiment of the present disclosure.

In another embodiment of the present disclosure, as illustrated in FIG. 6, the display panel 100 is a liquid crystal display panel 100 including an array substrate 1203, a liquid crystal layer 1202, and a color film substrate 1201. The light sensitive luminescent mark 101 is disposed on the surface of the color film substrate 1201 away from the liquid crystal layer 1202.

For example, the display panel 100 may be a liquid crystal display panel 100, and the bonding accuracy thereof may be detected by setting the light sensitive luminescent mark 101.

Figure 7:
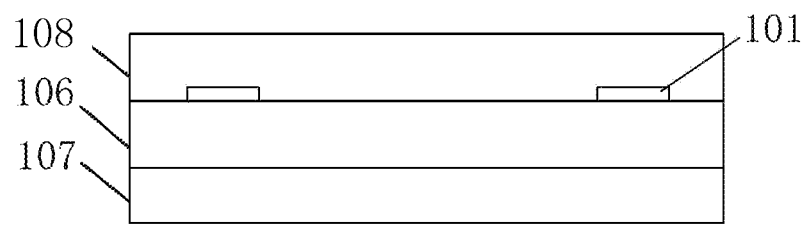
FIG. 7 illustrates a layer structure diagram of a display panel in a display device according to an embodiment of the present disclosure.

An embodiment of the present disclosure further provides a display device. The display panel in the display device in this embodiment is a touch display panel, which includes a display structure and a touch panel stacked on top of each other. In addition, the stacking order of the display structure and the touch panel is not particularly limited. As illustrated in FIG. 7, the display panel includes a display structure 108 and a touch panel 107 disposed on the display structure 108. The light sensitive luminescent mark 101 is provided in the display structure or in the touch panel 107. For example, the display structure 108 here may be an OLED display structure or a liquid crystal display structure.

Both the touch panel 107 and the display structure 108 are bonded by optical glue 106. Based on the rheological property of the optical glue 106, under certain temperature and pressure, the light sensitive luminescent mark 101 can reduce its thickness through deformation, absorption or filling. Its thickness is extremely thin and can reach micron level. Therefore, the arrangement of the light sensitive luminescent mark 101 will not cause physical influence on the adhesion between various elements in the display panel 100.

Figure 8:
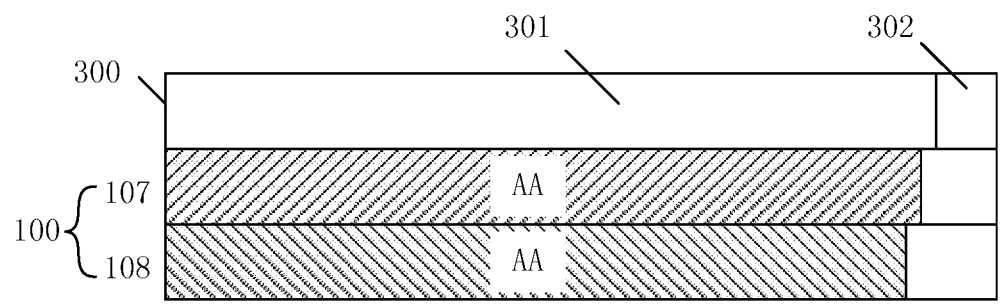
FIG. 8 illustrates a partial sectional view of a display device according to an embodiment of the present disclosure.

For example, FIG. 8 illustrates an example of the positional relationship between the touch display panel 100 and the cover plate. For example, the display structure 108 of the display panel 100 includes a display effective area AA, while the touch panel of the display panel 100 includes a touch effective area AA. For example, the effective area of the display panel 100 may be a display effective area of a display structure or a touch effective area of a touch panel. FIG. 8 here and FIG. 3 and FIG. 4 described above are partial cross-sectional views of the display device, for example, they show only a partial structure near the edge of the display device.

For example, in a direction parallel to the display panel, the display effective area of the display structure is located inside the touch effective area of the touch panel.

For example, the orthographic projection of the effective area of the display panel on a plane parallel to the display panel completely falls into the orthographic projection of the visible area of the cover plate on a plane parallel to the display panel. For example, the orthographic projection of the display effective area of the display structure of the display panel on the plane parallel to the display panel completely falls into the orthographic projection of the touch effective area of the touch panel on the plane parallel to the display panel.

Figure 9:
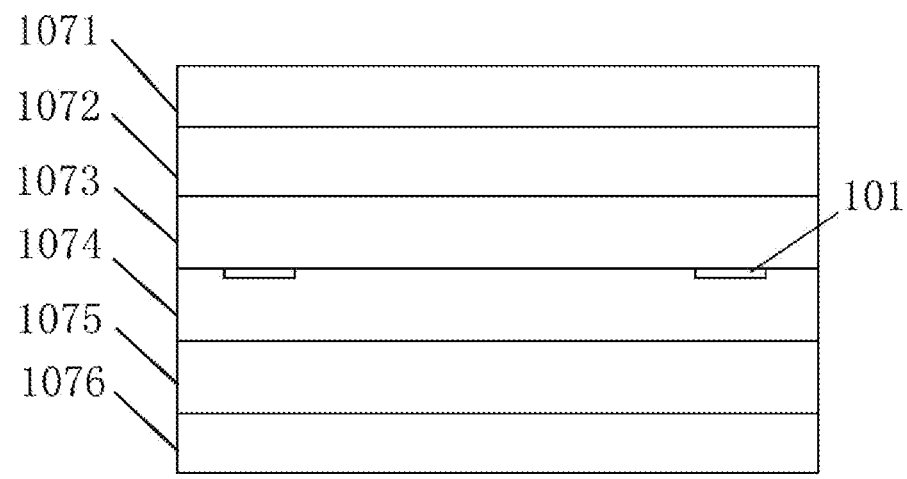
FIG. 9 illustrates a layer structure diagram of a touch panel in a display device according to an embodiment of the present disclosure.

In an embodiment of the present disclosure, as illustrated in FIG. 9, the touch panel 107 includes a second substrate 1076; a first transparent optical adhesive layer 1075 disposed on the second substrate 1076; a first ITO electrode layer 1074 disposed on the first transparent optical adhesive layer 1075; a second transparent optical adhesive layer 1073 disposed on the first ITO electrode layer 1074; a second ITO electrode layer 1072 disposed on the second transparent optical adhesive layer 1073; a protective film layer 1071 disposed on the second ITO electrode layer 1072. The light sensitive luminescent mark 101 is disposed on the surface of the first ITO electrode layer 1074 close to the second transparent optical adhesive layer 1073. Or the light sensitive luminescent mark 101 is disposed on the surface of the second ITO electrode layer 1072 close to the protective film layer 1071; or the light sensitive luminescent mark 101 is disposed on the surface of the protective film layer 1071 away from the second ITO electrode layer 1072.

For example, in the example illustrated in FIG. 9, the light sensitive luminescent mark 101 is disposed on the surface of the first ITO electrode layer 1074 close to the second transparent optical adhesive layer 1073, and the first ITO electrode layer 1074, the second ITO electrode layer 1072, and the second substrate 1076 in the touch panel 107 are all bonded by the optical adhesive layer. The second substrate 1105 and the first ITO electrode layer 1074 are bonded through the first transparent optical adhesive layer 1075, while the first ITO electrode layer 1074 and the second ITO electrode layer 1072 are bonded through the second transparent optical adhesive layer 1073. Based on the rheological property of the optical glue layer, under certain temperature and pressure, the light sensitive luminescent mark 101 can reduce its thickness through deformation, absorption or filling. Its thickness is extremely thin and can reach micron level. Therefore, the arrangement of the light sensitive luminescent mark 101 will not cause physical influence on the bonding between the layers in the touch panel 107.

For example, each ITO electrode layer described above is exemplary, and any suitable transparent electrode layer may be used according to embodiments of the present disclosure.

Figures 10, 11:
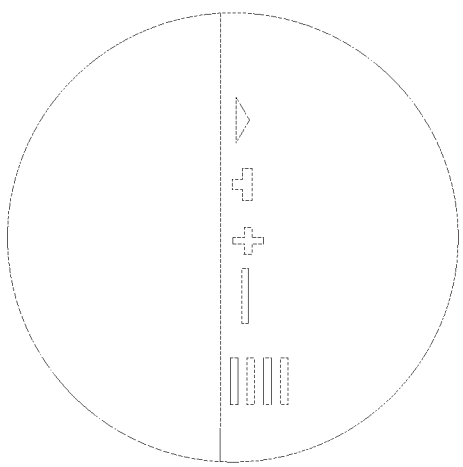
FIG. 10 illustrates a schematic shape diagram of a light sensitive luminescent mark in a display device according to an embodiment of the present disclosure.
FIG. 11 illustrates a flowchart of a method for detecting the bonding accuracy of the display device according to another embodiment of the present disclosure.

In an embodiment of the present disclosure, as illustrated in FIG. 10, the planar pattern of each light sensitive luminescent mark 101 is a bar, triangle, T-shaped or cross-shaped. However, embodiments according to the present disclosure are not limited thereto, and the planar pattern of the light sensitive luminescent marks may take any other suitable shape.

For example, each light sensitive luminescent mark 101 includes a plurality of sub-marks at equal intervals.

For example, each light sensitive luminescent mark has an overall elongated shape, and the extending direction of the elongated shape is parallel to the edge of the display panel adjacent to the light sensitive luminescent mark. For example, each light sensitive luminescent mark may be a separate strip shape or may be a plurality of sub-marks arranged along the above-mentioned extending direction.

For example, as illustrated in FIG. 10, the lowermost sub-mark includes a plurality of stripes arranged in a direction perpendicular to an edge adjacent to the light sensitive luminescent mark. For example, when detecting the fitting offset, the offset amount can be detected by detecting the number of stripes covered by the non-visible area around the visible area of the cover plate. For example, the plurality of stripes are parallel to the edge adjacent to the light sensitive luminescent mark and arranged at equal intervals.

For example, when it is necessary to accurately judge the bonding accuracy, the light sensitive luminescent marks 101 can be made into cursor code type and equidistant type, and the bonding distance can be accurately judged by recording the spacing between adjacent light sensitive luminescent marks 101.

FIG. 10 illustrates a method for detecting the bonding accuracy of the display device 200 according to another embodiment of the present disclosure. As illustrated in FIG. 10, the detection method includes the following steps: irradiating the display device 200 with light capable of causing the light sensitive luminescent mark 101 to emit light from the cover plate 300 side; detecting whether the light is emitted from the visible area 301, and judging whether the bonding accuracy of the display device 200 meets the standard according to the detection result.

For example, since the light sensitive luminescent mark 101 can emit light upon irradiation of the detection light, when the display device 200 is subjected to random inspection or full inspection, whether the detection light is emitted from the visible region 301 is detected by irradiating the display device 200 from the cover plate 300 side, and whether the adhesion accuracy of the display device 200 is up to standard is determined based on the detection result.

In a specific embodiment of this embodiment, judging whether the bonding accuracy of the display device 200 meets the standard according to the detection result comprises: judging that the bonding accuracy of the display device 200 meets the standard when detecting that the light is emitted from the visible region 301, in a case that the light sensitive luminescent mark 101 is disposed in the effective region 104 and the distance between the edge of the light sensitive luminescent mark 101 away from the boundary and the boundary is the bonding accuracy.

For example, when the light sensitive luminescent mark 101 is disposed in the effective area 104 of the display panel 100, that is, the light sensitive luminescent mark 101 is of "visible type", whether light emitted by the light sensitive luminescent mark is emitted from the visible area 301 is detected by irradiating the display device 200 with detection light. When the light emitted by the light sensitive luminescent mark 101 can be detected in the visible region 301 of the display device 200, this means that the deviation distance between the display panel 100 and the cover plate 300 is within the bonding accuracy, which means that the bonding accuracy of the display device 200 meets the standard. However, when the light emitted by the light sensitive luminescent mark 101 cannot be detected in the visible region 301 of the display device 200, this means that the deviation distance between the display panel 100 and the cover plate 300 is greater than the bonding accuracy, which means that the bonding accuracy of the display device 200 is not up to standard.

In a specific embodiment of this embodiment, the determining whether the bonding accuracy of the display device 200 meets the standard according to the detection result includes: judging that the bonding accuracy of the display device 200 meets the standard when not detecting that the light is emitted from the visible region 301, in a case that the light sensitive luminescent mark 101 is disposed in the routing area 105 and the distance between the edge of the light sensitive luminescent mark 101 close to the boundary and the boundary is the sum of the bonding accuracy and the projection distance.

For example, when the light sensitive luminescent mark 101 is disposed in the routing area 105 of the display panel 100, that is, the light sensitive luminescent mark 101 is of "hidden type", whether light emitted by the light sensitive luminescent mark is emitted from the visible area 301 is detected by irradiating the display device 200 with detection light. When the light emitted by the light sensitive luminescent mark 101 cannot be detected in the visible region 301 of the display device 200, this means that the deviation distance between the display panel 100 and the cover plate 300 is within the bonding accuracy, which means that the bonding accuracy of the display device 200 meets the standard. However, when the light emitted by the light sensitive luminescent mark 101 can be detected in the visible region 301 of the display device 200, this means that the deviation distance between the display panel 100 and the cover plate 300 is greater than the bonding accuracy, which means that the bonding accuracy of the display device 200 does not meet the standard.

Hereinafter, the detection method proposed in this embodiment will be described with reference to the actual application scenario: when processing the display device 200 in the actual processing factory, the light sensitive luminescent mark 101 is first formed on the display panel 100, and the light sensitive luminescent mark 101 is divided into two types, one is located in the effective area 104 of the display panel 100, and the other is located in the routing area 105 of the display panel 100. The worker can select one of the two setting modes to manufacture the display panel 100, and the display device 200 is obtained after the manufactured display panel 100 is attached to the cover plate 300. After the production of the display device 200, the worker needs to carry out random inspection or full inspection of the display device 200. The display device 200 can be irradiated by using the detection light to detect whether the visible area 301 of the display device 200 has light emitted by the light sensitive luminescent mark 101, and judge the adhesion accuracy of the display device 200 based on the detection result. Through the detection method described in this embodiment, the bonding accuracy of the liquid crystal module can be quickly detected, compared with the traditional microscopic examination, the rapidity is improved, the labor force and the working time of workers are saved, and the working efficiency is improved.

The above description is merely an exemplary embodiment of the present disclosure and is not intended to limit the scope of protection of the present disclosure, which is determined by the appended claims.

What is claimed is:

1. A display device comprising:
a display panel comprising an effective area and a peripheral area located around the effective area; and
a cover plate attached to the display panel, the cover plate comprising a visible region and a non-visible region located at the periphery of the visible region, and a boundary of the visible region of the cover plate is located outside a boundary of the effective region of the display panel in a direction parallel to the display panel;
at least one pair of light sensitive luminescent marks are arranged on the display panel and located near opposite sides of the display panel,
wherein in the direction parallel to the display panel, each of the at least one pair of light sensitive luminescent marks is disposed inside the effective area of the display panel and a distance between an inner edge of each light sensitive luminescent mark and the boundary of the effective area of the display panel is an offset limit value of the display panel and the cover plate; or, each of the at least one pair of light sensitive luminescent marks is disposed outside the visible region of the cover plate and the distance between the inner edge of each of the light sensitive luminescent marks and a boundary of the visible region is the offset limit value.

2. The display device according to claim 1, wherein the light sensitive luminescent markers comprise at least a first pair of oppositely disposed light sensitive luminescent markers and a second pair of oppositely disposed light sensitive luminescent markers, and wherein the first pair of oppositely disposed light sensitive luminescent markers are located near first opposite sides of the display panel, and the second pair of oppositely disposed light sensitive luminescent markers are located near second opposite sides of the display panel, wherein the first opposite sides are perpendicular to the second opposite sides.

3. The display device according to claim 1, wherein the display panel is an organic light emitting diode (OLED) display panel, comprising
a first substrate;
an anode formed on the first substrate;
a light emitting layer formed on the anode;
a cathode formed on the light emitting layer; and
a package protection layer formed on the cathode,
wherein the light sensitive luminescent marks are arranged on a surface of the light emitting layer close to the cathode or on a surface of the package protection layer away from the cathode.

4. The display device according to claim 1, wherein the display panel is a liquid crystal display panel, comprising
an array substrate and a color film substrate which are arranged opposite to each other; and
a liquid crystal layer arranged between the array substrate and the color film substrate,
wherein the light sensitive luminescent marks are arranged on a surface of the color film substrate away from the liquid crystal layer.

5. The display device according to claim 1, wherein the display panel is a touch display panel and comprises a display structure and a touch panel which are overlapped with each other,
wherein the light sensitive luminescent marks are arranged in the display structure or in the touch panel.

6. The display device according to claim 5, wherein the effective area of the display panel is a display effective area of the display structure or a touch effective area of the touch panel.

7. The display device according to claim 6, wherein the display effective area of the display structure is located inside the touch effective area of the touch panel in the direction parallel to the display panel.

8. The display device according to claim 4, wherein the touch panel comprises
a second substrate;
a first transparent optical adhesive layer disposed on the second substrate;
a first transparent electrode layer disposed on the first transparent optical adhesive layer;
a second transparent optical adhesive layer disposed on the first transparent electrode layer;
a second transparent electrode layer disposed on the second transparent optical adhesive layer; and
a protection layer disposed on the second transparent electrode layer,
wherein the light sensitive luminescent marks are arranged on at least one of the following positions:
on a surface of the first transparent electrode layer close to the second transparent optical adhesive layer;
on a surface of the second transparent electrode layer close to the protection layer; and
on a surface of the protection layer away from the second transparent electrode layer.

9. The display device according to claim 1, wherein each light sensitive luminescent mark has a planar shape of strip shape, triangular, T-shape or cross-shape.

10. The display device according to claim 1, wherein each of the light sensitive luminescent marks has an overall elongated shape, and an extension direction of the elongated shape is parallel to an edge of the display panel adjacent to the light sensitive luminescent mark.

11. The display device according to claim 1, wherein each of the light sensitive luminescent marks comprises a plurality of sub-marks, and the plurality of sub-marks are arranged along the extension direction.

12. The display device according to claim 11, wherein a plurality of sub-marks in each of the light sensitive luminescent marks are arranged at equal intervals.

13. The display device according to claim 11, wherein at least one sub-mark in each of the light sensitive luminescent marks or each of the light sensitive luminescent marks comprises a plurality of stripes arranged in a direction perpendicular to the edge adjacent to the light sensitive luminescent mark.

14. The display device according to claim 13, wherein the plurality of stripes are parallel to the edge adjacent to the light sensitive luminescent mark and are arranged at equal intervals.

15. The display device according to claim 1, wherein each of the light sensitive luminescent markers has a material of fluorescent material or phosphorescent material.

16. The display device according to claim 1, wherein an orthographic projection of the effective area of the display panel on a plane parallel to the display panel completely falls into an orthographic projection of the visible area of the cover plate on the plane parallel to the display panel.

17. The display device according to claim 7, wherein an orthographic projection of the display effective area of the display structure of the display panel on a plane parallel to the display panel completely falls into an orthographic projection of the touch effective area of the touch panel on the plane parallel to the display panel.

18. A method for detecting the bonding accuracy of the cover plate of the display device according to claim 1, comprising:
    irradiating the display device from the cover plate side with light capable of causing the light sensitive luminescent marks to emit light;
    detecting whether the light is emitted from the visible area, and judging whether the bonding accuracy of the display device meets a standard according to a detection result.

19. The method of claim 18, wherein judging whether the bonding accuracy of the display device meets the standard according to the detection result comprises
    in a case where each of the at least one pair of light sensitive luminescent marks is disposed inside the effective area of the display panel,
    judging that the bonding accuracy of the display device meets the standard when the light is detected to be emitted from the visible area;
    or
    in a case where each of the at least one pair of light sensitive luminescent marks is disposed outside the visible region of the cover plate,
    judging that the bonding accuracy of the display device meets the standard when it is not detected that the light is emitted from the visible area.

* * * * *